United States Patent
Lim et al.

(10) Patent No.: US 10,957,379 B2
(45) Date of Patent: *Mar. 23, 2021

(54) METHOD OF REFRESHING MEMORY USING MULTIPLE OPERATING VOLTAGES AND MEMORY DEVICE PERFORMING THE SAME

(71) Applicant: SAMSUNG ELECTRONICS CO., LTD., Suwon-si (KR)

(72) Inventors: Suk-Hyun Lim, Suwon-si (KR); Sang-Yun Kim, Hwaseong-si (KR); Duk-Ha Park, Suwon-si (KR); Eun-Ah Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/851,744

(22) Filed: Apr. 17, 2020

(65) Prior Publication Data

US 2020/0258567 A1     Aug. 13, 2020

Related U.S. Application Data

(62) Division of application No. 16/027,790, filed on Jul. 5, 2018, now Pat. No. 10,665,287.

(30) Foreign Application Priority Data

Nov. 14, 2017     (KR) .................. 10-2017-0151808

(51) Int. Cl.
G11C 7/00         (2006.01)
G11C 11/406       (2006.01)
G11C 11/4074      (2006.01)

(52) U.S. Cl.
CPC .... *G11C 11/40626* (2013.01); *G11C 11/4074* (2013.01); *G11C 11/40615* (2013.01)

(58) Field of Classification Search
CPC ................................................ G11C 11/40626
USPC .......................................................... 365/222
See application file for complete search history.

(56) References Cited

U.S. PATENT DOCUMENTS

| 5,867,438 | A  | 2/1999  | Nomura et al. |
| 6,665,225 | B2 | 12/2003 | Tsujino       |
| 6,946,865 | B2 | 9/2005  | Mizuno et al. |
| 7,251,170 | B2 | 7/2007  | Lee et al.    |
| 7,705,625 | B2 | 4/2010  | Yoo et al.    |

(Continued)

FOREIGN PATENT DOCUMENTS

KR         0203133 B1     3/1999

*Primary Examiner* — Hoai V Ho
(74) *Attorney, Agent, or Firm* — Volentine, Whitt & Francos, PLLC

(57) ABSTRACT

A memory device having memory cells operates in a normal mode, a first self refresh mode, and a second self refresh mode. The first self refresh mode provides a self refresh operation for retaining data stored in the memory cells without an external command. The time required to return to the normal mode from the first self refresh mode is shorter than a reference time. The second self refresh mode also provides the self refresh operation, but a time required to return to the normal mode from the second self refresh mode is longer than the reference time. The normal mode provides a higher operating voltage to the memory cells than does the second self refresh mode.

20 Claims, 12 Drawing Sheets

(56) References Cited

U.S. PATENT DOCUMENTS

| | | | |
|---|---|---|---|
| 8,373,499 B2 | 2/2013 | Moriguchi et al. | |
| 9,251,866 B2 | 2/2016 | Chun | |
| 10,665,287 B2* | 5/2020 | Lim | G11C 11/40615 |
| 2010/0165773 A1 | 7/2010 | Lim et al. | |
| 2013/0176803 A1 | 7/2013 | Lee et al. | |
| 2017/0117033 A1* | 4/2017 | Doo | G11C 11/40626 |
| 2017/0228175 A1 | 8/2017 | Kim | |
| 2018/0061483 A1 | 3/2018 | Morgan | |
| 2018/0190341 A1 | 7/2018 | Do et al. | |

\* cited by examiner

METHOD OF REFRESHING MEMORY USING MULTIPLE OPERATING VOLTAGES AND MEMORY DEVICE PERFORMING THE SAME

CROSS-REFERENCE TO RELATED APPLICATION

This is a Divisional of U.S. patent application Ser. No. 16/027,790, filed Jul. 5, 2018, which claims priority under 35 USC § 119 to Korean Patent Application No. 10-2017-0151808, filed on Nov. 14, 2017 in the Korean Intellectual Property Office (KIPO), the contents of which are herein incorporated by reference in their entirety.

BACKGROUND

1. Technical Field

Example embodiments relate generally to semiconductor memory devices, and more particularly to methods of operating memory devices and memory devices performing the methods.

2. Description of the Related Art

Semiconductor memory devices can be generally divided into two categories depending upon whether they retain stored data when disconnected from power. These two categories are referred to as volatile memory devices, which lose stored data when disconnected from power, and nonvolatile memory devices, which retain stored data when disconnected from power. In a volatile memory device, which is a type of semiconductor memory device, a refresh operation may be performed to retain data stored in memory cells. Recently, the volatile memory device may be employed in various mobile systems. Since it is important to reduce power consumption of the mobile system, researchers are also conducting various research projects on techniques to reduce power consumption of the volatile memory device included in the mobile system.

SUMMARY

At least one example embodiment of the present disclosure provides a method of operating a memory device that is capable of efficiently reducing power consumption of the memory device in a refresh mode.

At least one example embodiment of the present disclosure provides a memory device that is capable of efficiently reducing power consumption of the memory device in a refresh mode.

According to example embodiments, in a method of operating a memory device, the memory device includes a plurality of memory cells and operates in one of a normal mode, a first self refresh mode and a second self refresh mode. The first self refresh mode represents an operation mode in which a self refresh operation for retaining data stored in the plurality of memory cells is performed without an external command A time required to return to the normal mode from the first self refresh mode is shorter than a reference time. The second self refresh mode represents an operation mode in which the self refresh operation is performed. A time required to return to the normal mode from the second self refresh mode is longer than the reference time. In the normal mode, a first operating voltage having a first level is generated to provide the first operating voltage to the plurality of memory cells. When the memory device enters the second self refresh mode, a level of the first operating voltage is changed to a second level to provide the first operating voltage to the plurality of memory cells. The second level is lower than the first level.

According to example embodiments, in a method of operating a memory device, the memory device includes a plurality of memory cells and operates in one of a normal mode, a first self refresh mode and a second self refresh mode. The first self refresh mode represents an operation mode in which a self refresh operation for retaining data stored in the plurality of memory cells is performed without an external command A time required to return to the normal mode from the first self refresh mode is shorter than a reference time. The second self refresh mode represents an operation mode in which the self refresh operation is performed. A time required to return to the normal mode from the second self refresh mode is longer than the reference time. In the normal mode, a first operating voltage having a first variable level is generated to provide the first operating voltage to the plurality of memory cells. The first variable level is changed according to an operating temperature of the memory device. When the memory device enters the first self refresh mode, a level of the first operating voltage is changed to a first fixed level to provide the first operating voltage to the plurality of memory cells. The first fixed level is maintained regardless of the operating temperature of the memory device. When the memory device enters the second self refresh mode, the level of the first operating voltage is changed to a second fixed level to provide the first operating voltage to the plurality of memory cells. The second fixed level is lower than the first variable level and the first fixed level and is maintained regardless of the operating temperature of the memory device.

According to example embodiments, a memory device includes a memory cell array, a first voltage controller and a first voltage regulator. The memory cell array includes a plurality of memory cells that operate based on a first operating voltage. The first voltage controller generates a first voltage control signal for controlling a level of the first operating voltage based on a first control signal and a second control signal. The first voltage regulator generates the first operating voltage based on a power supply voltage and the first voltage control signal, sets the level of the first operating voltage to a first level in a normal mode, sets the level of the first operating voltage to a second level in a first self refresh mode, and sets the level of the first operating voltage to a third level in a second self refresh mode. The third level is lower than the first level and the second level. The first self refresh mode represents an operation mode in which a self refresh operation for retaining data stored in the plurality of memory cells is performed without an external command. A time required to return to the normal mode from the first self refresh mode is shorter than a reference time. The second self refresh mode represents an operation mode in which the self refresh operation is performed. A time required to return to the normal mode from the second self refresh mode is longer than the reference time.

According to an exemplary embodiment, a method of refreshing data stored by a memory cell of a nonvolatile memory device includes: (1) refreshing the data stored by the memory cell, during a first operational mode of the nonvolatile memory device, by applying a first refresh voltage to the memory cell, and (2) refreshing the data stored by the memory cell, during a second operational mode of the nonvolatile memory device, by applying a second refresh voltage to the memory cell. A maximum amplitude of the first refresh voltage exceeds a maximum amplitude of the second refresh voltage.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
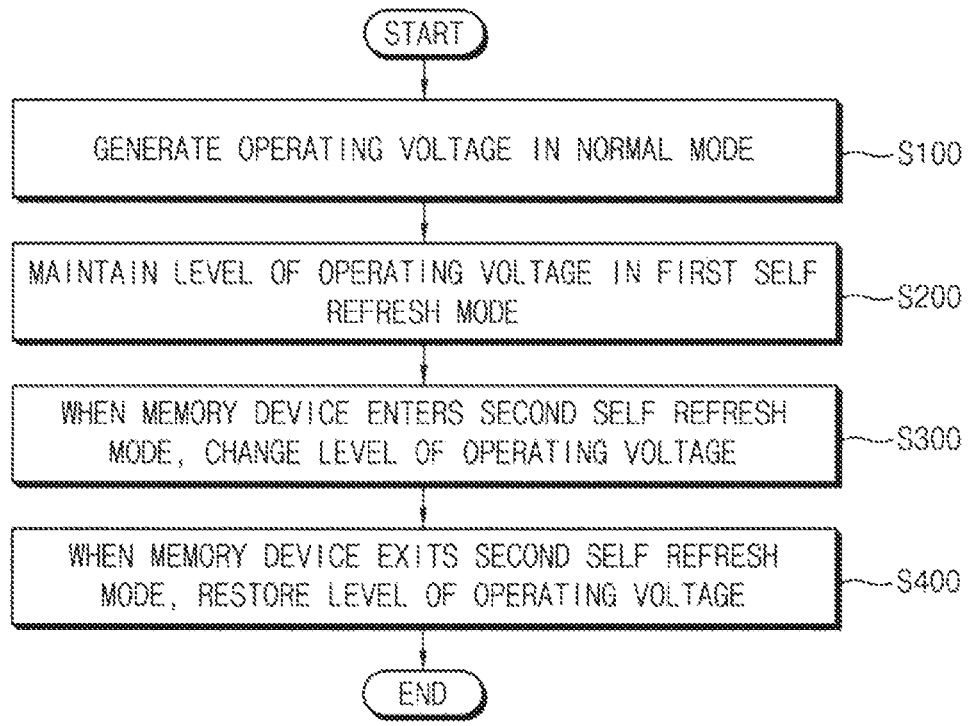
FIG. 1 is a flow chart illustrating a method of operating a memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

Figure 2:
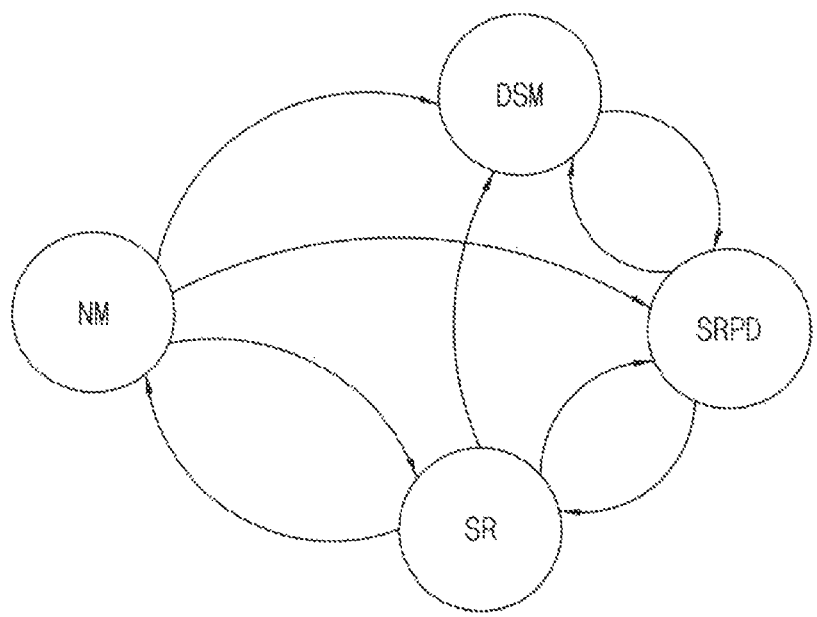
FIG. 2 is a diagram for describing an operation mode of a memory device according to example embodiments.

FIG. 1 is a flow chart illustrating a method of operating a memory device according to example embodiments. FIG. 2 is a diagram for describing an operation mode of a memory device according to example embodiments.

Referring to FIGS. 1 and 2, in a method of operating a memory device according to example embodiments, the memory device includes a plurality of memory cells and performs a refresh operation for retaining or preserving data stored in the plurality of memory cells. Particularly, the memory device performs a self refresh operation for retaining the data stored in the plurality of memory cells without an external command from an external device (e.g., an external memory controller).

The memory device operates in one of a plurality of operation modes, which include a normal mode and two or more self refresh modes. The normal mode represents an operation mode in which typical operations, e.g., a data read operation, a data write operation, or the like, are performed. A first self refresh mode represents an operation mode in which the self refresh operation is performed, and a time (e.g., an exit time) required to return from the first self refresh mode to the normal mode is shorter than a reference time. A second self refresh mode represents an operation mode in which the self refresh operation is performed, and a time required to return from the second self refresh mode to the normal mode is longer than the reference time.

For example, as illustrated in FIG. 2, the plurality of operation modes of the memory device may include a normal mode NM, a regular self refresh mode SR, a self refresh with power down mode SRPD and a deep sleep mode DSM. The self refresh operation may be performed in each of the regular self refresh mode SR, the self refresh with power down mode SRPD and the deep sleep mode DSM. While the self refresh operation is paused, the memory device may have an idle state in the regular self refresh mode SR, may have a power down state in the self refresh with power down mode SRPD, and may have a deep sleep state in the deep sleep mode DSM.

The memory device operating in the normal mode NM may enter one of the regular self refresh mode SR, the self refresh with power down mode SRPD and the deep sleep mode DSM. The memory device operating in the regular self refresh mode SR may enter one of the normal mode NM, the self refresh with power down mode SRPD, and the deep sleep mode DSM. The memory device operating in the self refresh with power down mode SRPD may enter the regular self refresh mode SR and the deep sleep mode DSM. The memory device operating in the deep sleep mode DSM may enter the self refresh with power down mode SRPD.

When the memory device exits the regular self refresh mode SR, the memory device may immediately enter the normal mode NM. However, when the memory device exits the self refresh with power down mode SRPD or the deep sleep mode DSM, the memory device may not immediately enter the normal mode NM. For example, when the memory device exits the self refresh with power down mode SRPD, the memory device may enter the normal mode NM via the regular self refresh mode SR. When the memory device exits the deep sleep mode DSM, the memory device may enter the normal mode NM via the self refresh with power down mode SRPD and the regular self refresh mode SR sequentially. Thus, a time required to exit the regular self refresh mode SR may be relatively short, and a time required to exit the self refresh with power down mode SRPD or the deep sleep mode DSM may be relatively long.

As used herein, the term "first self refresh mode" may correspond to the regular self refresh mode SR in FIG. 2, and the term "second self refresh mode" may correspond to the deep sleep mode DSM in FIG. 2. Alternatively, the term "second self refresh mode" may correspond to the self refresh with power down mode SRPD in FIG. 2.

Hereinafter, the present disclosure will be described in detail based on an example where the second self refresh mode corresponds to the deep sleep mode DSM in FIG. 2.

In the normal mode NM, an operating voltage is generated to provide the operating voltage to the plurality of memory cells that are included in the memory device (step S100). As described above, the data may be stored in the plurality of memory cells, and the plurality of memory cells may operate based on the operating voltage.

In the first self refresh mode SR, a level of the operating voltage may be maintained to provide the operating voltage to the plurality of memory cells (step S200). In other words, in the first self refresh mode SR, the memory device may perform the self refresh operation based on the operating voltage having an unchanged or maintained level.

When the memory device enters the second self refresh mode DSM, the level of the operating voltage is changed to provide the operating voltage to the plurality of memory cells (step S300). In other words, in the second self refresh mode DSM, the memory device may perform the self refresh operation based on the operating voltage having a changed or varied level. The level of the operating voltage may be changed to reduce power consumption of the memory device.

In some example embodiments, the operating voltage may include at least one of a boost voltage that has a level higher than a level of a power supply voltage, and a negative voltage that has a level lower than a level of a ground voltage. For example, if the operating voltage in step S300 corresponds to the boost voltage, a level of the boost voltage may decrease in step S300. For another example, if the operating voltage in step S300 corresponds to the negative voltage, a level of the negative voltage may increase in step S300.

When the memory device exits the second self refresh mode DSM, the level of the operating voltage may be restored (step S400). As described above, since a time required to return from the second self refresh mode DSM to the normal mode NM is longer than the reference time, the level of the operating voltage may be restored to an origin level (e.g., a level in the normal mode NM) before the memory device enters the normal mode NM. For example, if the operating voltage in step S400 corresponds to the boost voltage, the level of the boost voltage may increase in step S400. For another example, if the operating voltage in step S400 corresponds to the negative voltage, the level of the negative voltage may decrease in step S400.

Thus, in the normal mode NM after the second self refresh mode DSM is terminated, the operating voltage having a restored level may be provided to the plurality of memory cells.

Figure 3:
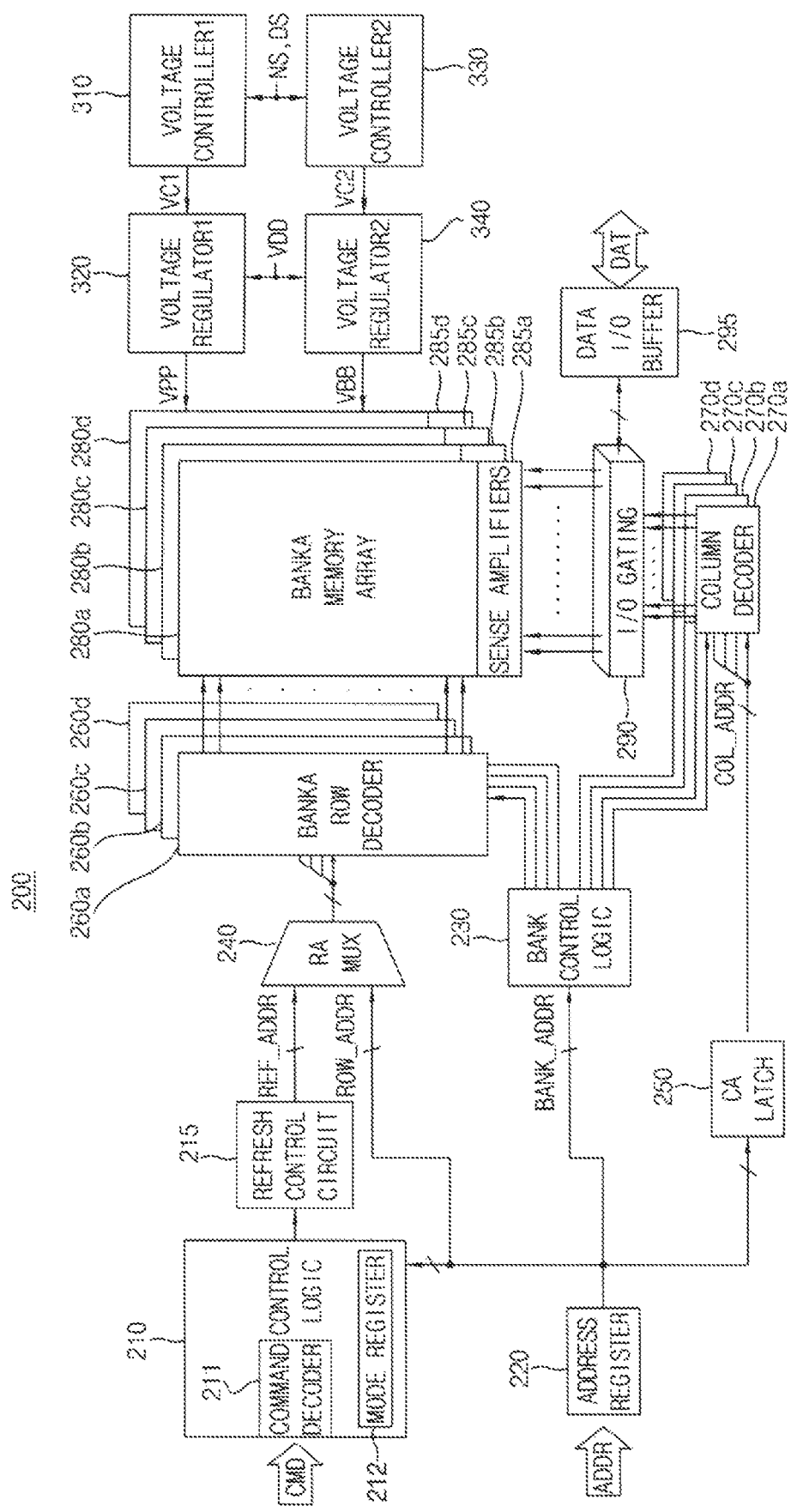
FIG. 3 is a block diagram illustrating a memory device according to example embodiments.

FIG. 3 is a block diagram illustrating a memory device according to example embodiments.

Referring to FIG. 3, a memory device 200 includes a control logic circuit 210, a refresh control circuit 215, an address register 220, a bank control logic circuit 230, a row address multiplexer 240, a column address latch 250, a row decoder, a column decoder, a memory cell array, a sense amplifier unit, an input/output (I/O) gating circuit 290, a data I/O buffer 295, a first voltage controller 310, a first voltage regulator 320, a second voltage controller 330 and a second voltage regulator 340. A person of ordinary skill in the art should understand and appreciate that the disclosure is not limited to the quantities of components shown and described in FIG. 3.

In some example embodiments, the memory device 200 may be a volatile memory device in which the refresh operation, e.g., the self refresh operation, is required. For example, the memory device 200 may be one of various volatile memory devices such as a dynamic random access memory (DRAM), a mobile DRAM, a dual data rate (DDR) DRAM, a low power DDR (LPDDR) DRAM, a graphic DDR (GDDR) DRAM, or the like.

The memory cell array includes a plurality of memory cells. The memory cell array may include a plurality of bank arrays, e.g., first through fourth bank arrays 280a, 280b, 280c and 280d. The row decoder may include a plurality of bank row decoders, e.g., first through fourth bank row decoders 260a, 260b, 260c and 260d connected to the first through fourth bank arrays 280a, 280b, 280c and 280d, respectively. The column decoder may include a plurality of bank column decoders, e.g., first through fourth bank column decoders 270a, 270b, 270c and 270d connected to the first through fourth bank arrays 280a, 280b, 280c and 280d, respectively. The sense amplifier unit may include a plurality of bank sense amplifiers, e.g., first through fourth bank sense amplifiers 285a, 285b, 285c and 285d connected to the first through fourth bank arrays 280a, 280b, 280c and 280d, respectively.

The first through fourth bank arrays 280a~280d, the first through fourth bank row decoders 260a~260d, the first through fourth bank column decoders 270a~270d, and the first through fourth bank sense amplifiers 285a~285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank. Although FIG. 3 illustrates the memory device 200 including four banks, in other example embodiments, the memory device 200 may include any number of banks. Nor is there a requirement that the components shown in FIG. 3 in quantities of four have a one-to-one correspondence with each other. In other words, there could be more or less decoders or sensors than shown.

Figure 14:
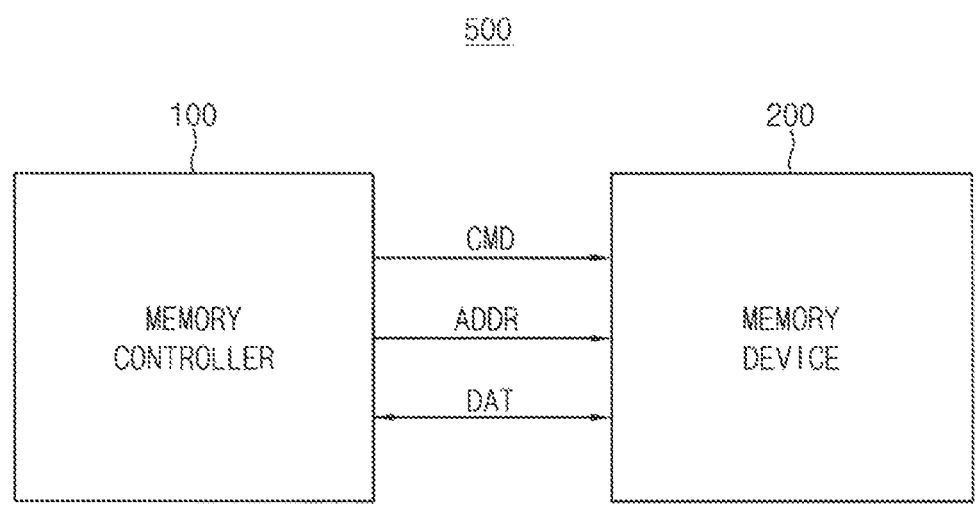
FIG. 14 is a block diagram illustrating a memory system including a memory device according to example embodiments.

The address register 220 may receive an address ADDR including a bank address BANK_ADDR, a row address ROW_ADDR and a column address COL_ADDR from a memory controller (e.g., a memory controller 100 in FIG. 14). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to receipt of the bank address BANK_ADDR. One of the first through fourth bank row decoders 260a-260d corresponding to the received bank address BANK_ADDR may be activated in response to the bank control signals generated by the bank control logic circuit 230, and one of the first through fourth bank column decoders 270a-270d corresponding to the received bank address BANK_ADDR may be activated in response to the bank control signals generated by the bank control logic circuit 230.

The refresh control circuit 215 may generate a refresh address REF_ADDR in response to receipt of a refresh command or entrance of any self refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic circuit 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a~260d.

The activated one of the first through fourth bank row decoders 260a~260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a~270d.

The activated one of the first through fourth bank column decoders 270a~270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, although not shown, the I/O gating circuit 290 may include an input data mask logic, read data latches for storing data output from the first through fourth bank arrays 280a-280d, and write drivers for writing data to the first through fourth bank arrays 280a~280d.

Data to be read from one of the first through fourth bank arrays 280a~280d may be sensed by a sense amplifier coupled to the one bank array, and may be stored in the read data latches. The data, DAT, stored in the read data latches may be provided to the memory controller via the data I/O buffer 295 and data bus/data terminals DQ. Data, DAT, received via data terminals/data bus DQ that are to be written to one of the first through fourth bank arrays 280a~280d may be provided from the memory controller to the data I/O buffer 295. The data, DAT, received via data terminals/data bus DQ provided to the data I/O buffer 295 may be written to the one bank array via the write drivers in the I/O gating circuit 290.

The control logic circuit 210 may control an operation of the memory device 200. For example, the control logic circuit 210 may generate control signals for the memory device 200 to perform a data write operation or a data read operation. The control logic circuit 210 may include a command decoder 211 that decodes a command CMD received from the memory controller and a mode register 212 that sets an operation mode of the memory device 200. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The control logic circuit 210 may further receive a clock signal (e.g., CLK) and a clock enable signal (e.g., /CKE) for operating the memory device 200 in a synchronous manner.

The first voltage controller 310 generates a first voltage control signal VC1 for controlling a level of a first operating voltage VPP based on a first control signal NS and a second control signal DS. The second voltage controller 330 may generate a second voltage control signal VC2 for controlling a level of a second operating voltage VBB based on the first control signal NS and the second control signal DS.

The first voltage regulator 320 generates the first operating voltage VPP based on a power supply voltage VDD and the first voltage control signal VC1. For example, as described with reference to FIG. 1, the first voltage regulator 320 may control the level of the first operating voltage VPP based on first voltage control signal VC1 and according to an operation mode of the memory device 200. The first operating voltage VPP may be a boost voltage that has a level higher than a level of the power supply voltage VDD.

The second voltage regulator 340 may generate the second operating voltage VBB based on the power supply voltage VDD and the second voltage control signal VC2. For example, as described with reference to FIG. 1, the second voltage regulator 340 may control the level of the second operating voltage VBB based on second voltage control signal VC2 and according to the operation mode of the memory device 200. The second operating voltage VBB may be a negative voltage that has a level lower than a level of a ground voltage.

In some example embodiments, each of the first voltage regulator 320 and the second voltage regulator 340 may include a charge pump.

The plurality of memory cells that are included in the memory cell array may operate based on the first operating voltage VPP and the second operating voltage VBB. Although not illustrated in FIG. 3, the first operating voltage VPP may also provided to the row decoder.

Although FIG. 3 illustrates an example where the level changing operation and the level restoring operation are performed for both the first operating voltage VPP and the second operating voltage VBB, the example embodiments may not be limited thereto. For example, the level changing operation and the level restoring operation are performed for only the first operating voltage VPP, and thus the second voltage controller 330 in FIG. 3 may be omitted. For another example, the level changing operation and the level restoring operation are performed for only the second operating voltage VBB, and thus the first voltage controller 310 in FIG. 3 may be omitted.

Although FIG. 3 illustrates an example where one boost voltage (e.g., VPP) and one negative voltage (e.g., VBB) are used for operating the memory device 200, the example embodiments may not be limited thereto, and two or more boost voltages and/or two or more negative voltages may be used for operating the memory device. For example, a first negative voltage (e.g., VBB1) and a second negative voltage (e.g., VBB2) that has a level higher than a level of the first negative voltage may be provided to the memory cell array, and the memory device may include a voltage controller and a voltage regulator for the first negative voltage and a voltage controller and a voltage regulator for the second negative voltage.

Figure 4:
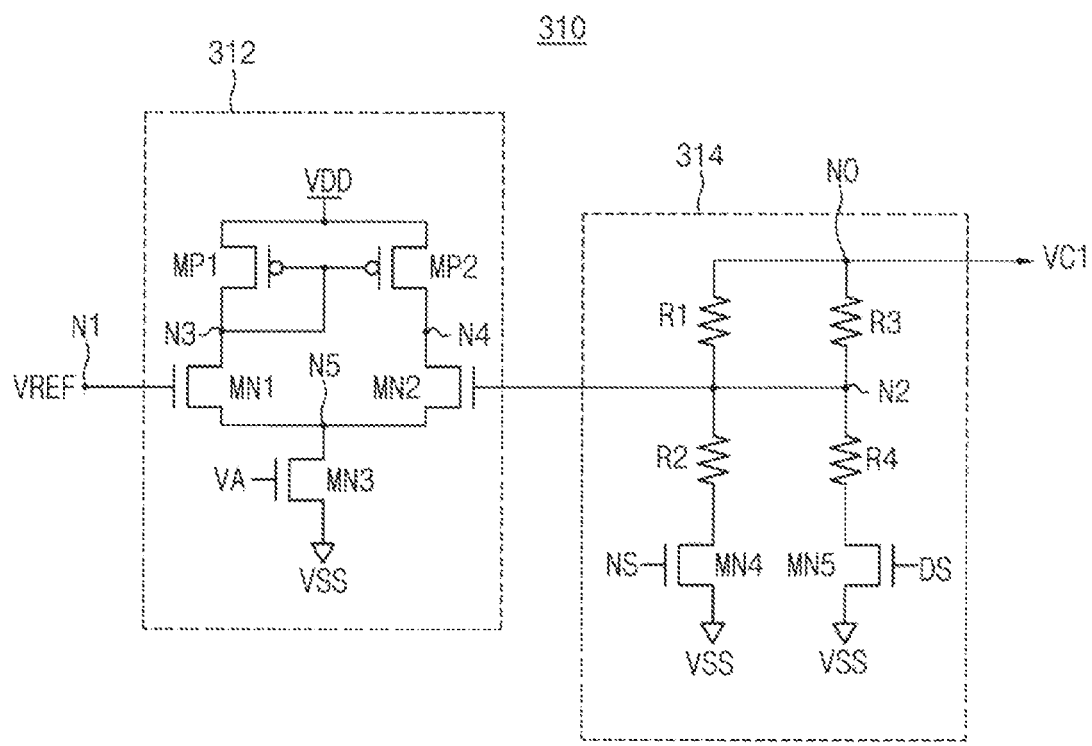
FIG. 4 is a circuit diagram illustrating an example of a voltage controller included in the memory device of FIG. 3.

FIG. 4 is a circuit diagram illustrating an example of a voltage controller included in the memory device of FIG. 3.

Referring to FIGS. 3 and 4, the first voltage controller 310 included in the memory device 200 may include a first circuit 312 and a second circuit 314.

The first circuit 312 may be connected to a first node N1 receiving a reference voltage VREF, and a second node N2. The first circuit 312 may include a plurality of transistors MP1, MP2, MN1, MN2 and MN3.

The transistor MP1 may be connected between the power supply voltage VDD and a third node N3, and may include a gate electrode connected to the third node N3. The transistor MP2 may be connected between the power supply voltage VDD and a fourth node N4, and may include a gate electrode. The gate electrode of the transistor MP1 and the gate electrode of the transistor MP2 may be connected to each other. The transistor MN1 may be connected between the third node N3 and a fifth node N5, and may include a gate electrode connected to the first node N1. The transistor MN2 may be connected between the fourth node N4 and the fifth node N5, and may include a gate electrode connected to the second node N2. The transistor MN3 may be connected between the fifth node N5 and a ground voltage VSS, and may include a gate electrode receiving a voltage VA.

The second circuit 314 may be connected to the second node N2, and an output node NO outputting the first voltage control signal VC1. The second circuit 314 may receive the first control signal NS and the second control signal DS. The second circuit 314 may include a plurality of resistors R1, R2, R3 and R4 and a plurality of transistors MN4 and MN5.

The first resistor R1 may be connected between the output node NO and the second node N2. The third resistor R3 may be connected in parallel with the first resistor R1 between the output node NO and the second node N2. The second resistor R2 and the transistor MN4 may be connected in series between the second node N2 and the ground voltage VSS. In other words, the second resistor R2 may be connected to the second node N2. The transistor MN4 may be connected between the second resistor R2 and the ground voltage VSS, and may include a gate electrode receiving the first control signal NS. The fourth resistor R4 and the transistor MN5 may be connected in series between the second node N2 and the ground voltage VSS. In other words, the fourth resistor R4 may be connected to the second node N2. The transistor MN5 may be connected between the fourth resistor R4 and the ground voltage VSS, and may include a gate electrode receiving the second control signal DS. An element including the second resistor R2 and the transistor MN4 and an element including the fourth resistor R4 and the transistor MN5 may be connected in parallel with each other between the second node N2 and the ground voltage VSS.

In some example embodiments, resistances of the plurality of resistors R1, R2, R3 and R4 may be set according to a target level of the first operating voltage VPP that is to be changed. An example of the resistances of the resistors R1, R2, R3 and R4 will be described in detail with reference to FIG. 6A.

In some example embodiments, as illustrated in FIG. 4, each of the transistors MP1 and MP2 may be a p-type metal oxide semiconductor (PMOS) transistor, and each of the transistors MN1, MN2, MN3, MN4 and MN5 may be an n-type metal oxide semiconductor (NMOS) transistor. In other example embodiments, although not illustrated in FIG. 4, types of the transistors MP1, MP2, MN1, MN2, MN3, MN4 and MN5 may be changed.

Although not illustrated in FIG. 4, the second voltage controller 330 included in the memory device 200 may have a structure that is substantially the same as a structure of the first voltage controller 310, however, resistances of resistors included in the second voltage controller 330 may be different from the resistances of the resistors R1, R2, R3 and R4 included in the first voltage controller 310 according to a target level of the second operating voltage VBB that is to be changed.

Figure 5:
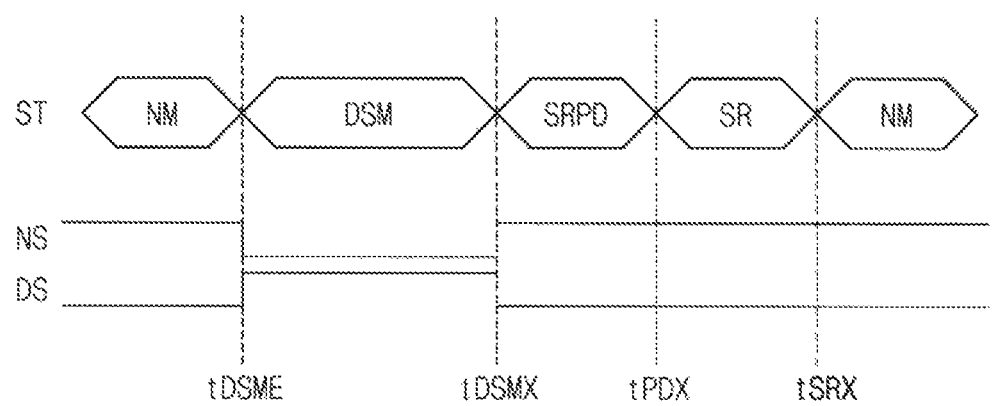
FIG. 5 is a timing diagram for describing an operation of the voltage controller of FIG. 4.

FIG. 5 is a timing diagram for describing an operation of the voltage controller of FIG. 4.

Referring to FIGS. 2, 3, 4 and 5, when an operating state ST of the memory device 200 is the normal mode NM, e.g., while the memory device 200 operates in the normal mode NM, the first control signal NS has a logic high level, and the second control signal DS has a logic low level. The transistor MN4 is turned on, the transistor MN5 is turned off, and the first voltage control signal VC1 is generated based on the resistors R1 and R2.

At time tDSME, the memory device 200 enters the second self refresh mode DSM, the first control signal NS is transitioned from the logic high level to the logic low level, and the second control signal DS is transitioned from the logic low level to the logic high level. In the second self refresh mode DSM, the transistor MN4 is turned off, the transistor MN5 is turned on, and the first voltage control signal VC1 is generated based on the resistors R3 and R4. Thus, in comparison with the normal mode NM, the levels of the operating voltages VPP and VBB may be changed in the second self refresh mode DSM.

At time tDSMX, the memory device 200 exits the second self refresh mode DSM, the first control signal NS is transitioned from the logic low level to the logic high level, and the second control signal DS is transitioned from the logic high level to the logic low level. In other words, the second control signal DS may be activated during only the second self refresh mode DSM. The first control signal NS, which is complementary to the second control signal DS, may be deactivated during only the second self refresh mode DSM.

As described with reference to FIG. 2, when the memory device 200 exits the second self refresh mode DSM, the memory device 200 may not immediately enter the normal mode NM and may enter the normal mode NM via the self refresh with power down mode SRPD and the first self refresh mode SR. For example, at time tDSMX, the memory device 200 exits the second self refresh mode DSM and enters the self refresh with power down mode SRPD. At time tPDX, the memory device 200 exits the self refresh with power down mode SRPD and enters the first self refresh mode SR. At time tSRX, the memory device 200 exits the first self refresh mode SR and enters the normal mode NM. A time interval from time tDSMX to time tSRX may correspond to the time required to return from the second self refresh mode DSM to the normal mode NM. For example, the time interval from time tDSMX to time tSRX may be longer than about 200 us. The levels of the operating voltages VPP and VBB may be restored during the time interval from time tDSMX to time tSRX.

Figure 6A:
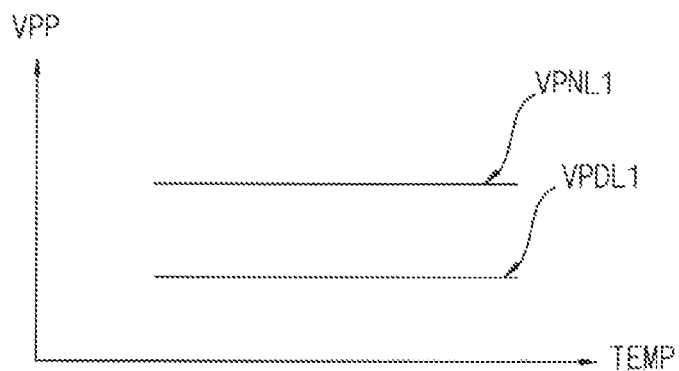
FIGS. 6A and 6B are graphs for describing an example of changing a level of an operating voltage according to example embodiments.
Figure 6B:
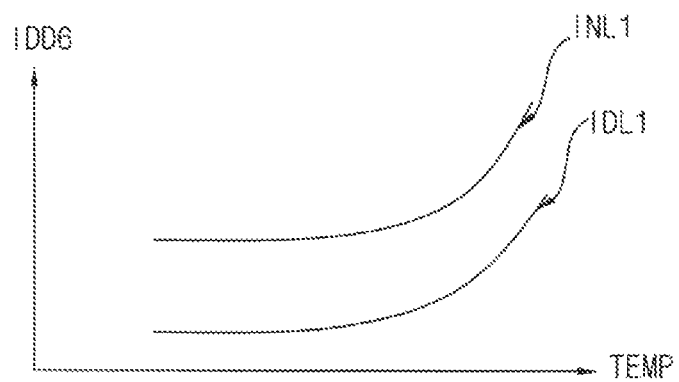

FIGS. 6A and 6B are graphs for describing an example of changing a level of an operating voltage according to example embodiments.

Referring to FIGS. 1, 2, 3, 4 and 6A, in the normal mode NM, the memory device 200 may generate the first operating voltage VPP having a first level VPNL1 to provide the first operating voltage VPP to the plurality of memory cells (step S100). In the first self refresh mode SR, the memory device 200 may maintain the level of the first operating voltage VPP at the first level VPNL1 to provide the first operating voltage VPP to the plurality of memory cells (step S200). When the memory device 200 enters the second self refresh mode DSM, the memory device 200 may change the level of the first operating voltage VPP to a second level VPDL1 based on the first voltage control signal VC1 to provide the first operating voltage VPP to the plurality of memory cells (step S300). The second level VPDL1 may be lower than the first level VPNL1. When the memory device 200 exits the second self refresh mode DSM, the memory device 200 may restore the level of the first operating voltage VPP to the first level VPNL1 before the memory device 200 enters the normal mode NM (step S400). For example, the first level VPNL1 may be about 3.4 V, and the second level VPDL1 may be about 3.0 V. Each of the first level VPNL1 and the second level VPDL1 may be a fixed level that is maintained regardless of an operating temperature TEMP of the memory device 200.

In some example embodiments, to generate the first voltage control signal VC1 for decreasing the level of the first operating voltage VPP in the second self refresh mode DSM, the resistance of the first resistor R1 may be greater than the resistance of the third resistor R3 (e.g., R1>R3), the resistance of the second resistor R2 may be smaller than the resistance of the fourth resistor R4 (e.g., R2<R4), and a first value obtained by dividing the resistance of the second resistor R2 by the resistance of the first resistor R1 may be smaller than a second value obtained by dividing the resistance of the fourth resistor R4 by the resistance of the third resistor R3 (e.g., R2/R1<R4/R3).

Referring to FIGS. 2, 6A and 6B, in the normal mode NM and the first self refresh mode SR in which the first operating voltage VPP has the first level VPNL1, a self refresh current IDD6 may have a first value that varies with temperature TEMP of the memory device 200 according to a first curve INL1. In the second self refresh mode DSM in which the first operating voltage VPP has the second level VPDL1, the self refresh current IDD6 may have a second value that varies with temperature TEMP of the memory device 200 according to a second curve IDLE The second value may be lower than the first value. As illustrated in FIG. 6B, the self refresh current IDD6 may be reduced in the second self refresh mode DSM, and thus the power consumption of the memory device 200 may also be reduced.

Figure 7:
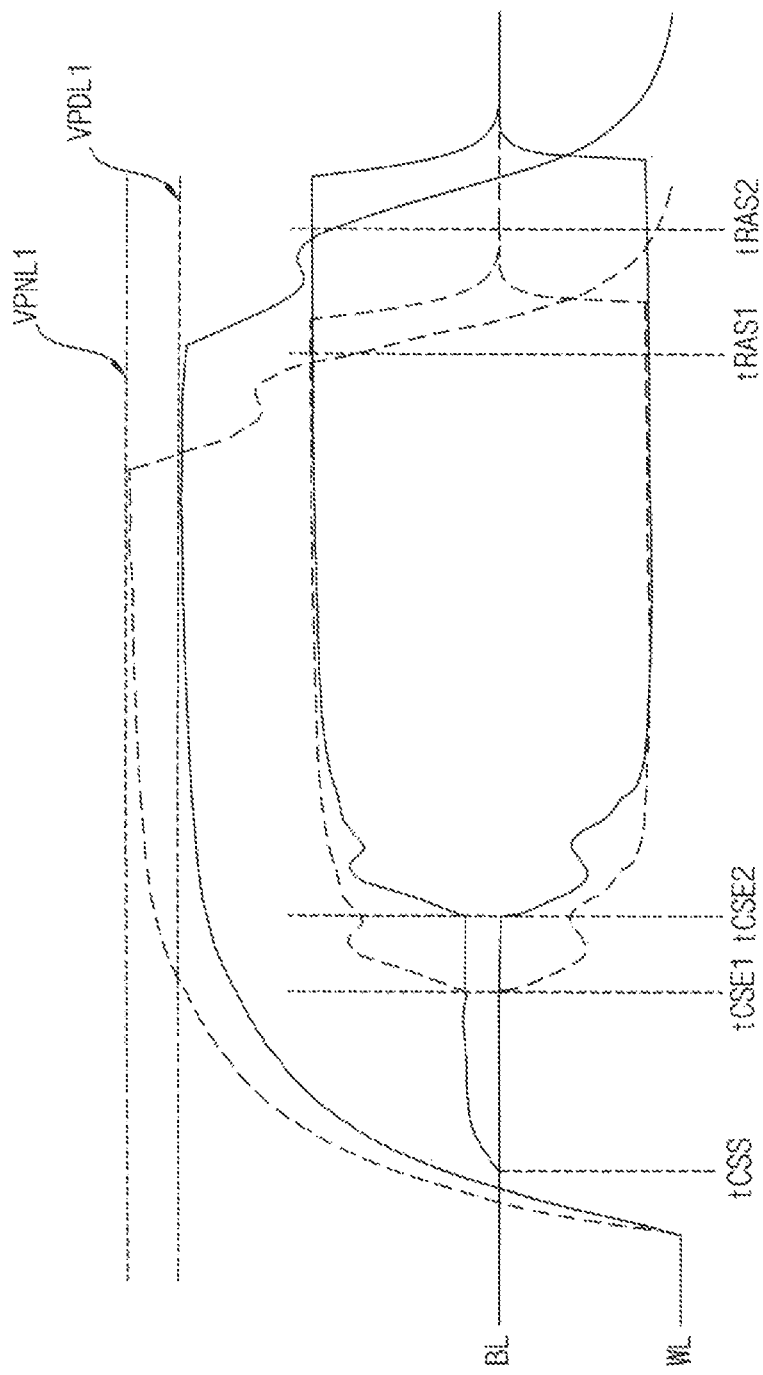
FIG. 7 is a graph for describing an example of compensating a characteristic of a self refresh operation according to example embodiments.

FIG. 7 is a graph for describing an example of compensating a characteristic of a self refresh operation according to example embodiments.

In FIG. 7, "WL" represents a voltage change on a wordline WL connected to a memory cell while the self refresh operation is performed, and "BL" represents a voltage change on a bitline BL connected to the memory cell while the self refresh operation is performed. In addition, dotted curves represent the voltage changes on the wordline WL and the bitline BL while the self refresh operation is performed in the first self refresh mode SR, and solid curves represent the voltage changes on the wordline WL and the bitline BL while the self refresh operation is performed in the second self refresh mode DSM.

Referring to FIGS. 1, 2, 3, 6A and 7, when the self refresh operation begins in the first self refresh mode SR, the first operating voltage VPP having the first level VPNL1 (e.g., a regular level) is applied to the wordline WL, and a voltage on the wordline WL increases to the first level VPNL1, as illustrated by the dotted curve. The bitline BL has been precharged to a predetermined level, and a charge sharing operation begins at time tCSS. At time tCSE1, the sense amplifier unit is enabled, the charge sharing operation terminates, and an amplifying operation for retaining data stored in the memory cell begins, as illustrated by the dotted curve. At time tRAS1 at which a predetermined or sufficient time elapses from time tCSE1, the sense amplifier unit is disabled, and the bitline BL is precharged to the predetermined level again, as illustrated by the dotted curve.

In the method of operating the memory device 200 according to example embodiments, an execution time of the self refresh operation in the second self refresh mode DSM may be adaptively controlled according to a level change of the first operating voltage VPP to compensate or enhance a characteristic of the self refresh operation in the second self refresh mode DSM.

In some example embodiments, while the self refresh operation is performed in the second self refresh mode DSM, an end time of the charge sharing operation that is performed for the bitline BL may be changed to adaptively control the execution time of the self refresh operation. For example, an end time of the charge sharing operation may correspond to time tCSE1 in the first self refresh mode SR, as illustrated by the dotted curve in FIG. 7. An end time of the charge sharing operation may correspond to time tCSE2, which is later than time tCSE1, in the second self refresh mode DSM, as illustrated by the solid curve in FIG. 7. In other words, in the second self refresh mode DSM, an execution time of the charge sharing operation for the self refresh operation may increase, and a time point at which the sense amplifier unit is enabled for the self refresh operation may be delayed.

In other example embodiments, after the self refresh operation is performed in the second self refresh mode DSM, a start time of the precharge operation that is performed for the bitline BL may be changed to adaptively control the execution time of the self refresh operation. For example, a start time of the precharge operation may correspond to time tRAS1 in the first self refresh mode SR, as illustrated by the dotted curve in FIG. 7. A start time of the precharge operation may correspond to time tRAS2, which is later than time tRAS1, in the second self refresh mode DSM, as illustrated by the solid curve in FIG. 7. In other words, in the second self refresh mode DSM, a time interval for enabling the sense amplifier unit for the self refresh operation, e.g., an enable time or an operation time of the sense amplifier unit may increase, and a time point at which the sense amplifier unit is disabled for terminating the self refresh operation may be delayed.

In conclusion, when the self refresh operation begins in the second self refresh mode DSM, the first operating voltage VPP having the second level VPDL1 (e.g., a relatively low level) is applied to the wordline WL, and the voltage on the wordline WL increases to the second level VPDL1, as illustrated by the solid curve. The bitline BL has been precharged to the predetermined level, and the charge sharing operation begins at time tCSS. At time tCSE2 that is later than time tCSE1, the sense amplifier unit is enabled, the charge sharing operation terminates, and the amplifying operation for retaining the data stored in the memory cell begins, as illustrated by the solid curve. At time tRAS2 that is later than time tRAS1, the sense amplifier unit is disabled, and the bitline BL is precharged to the predetermined level again, as illustrated by the solid curve.

Although FIG. 7 illustrates an example where both the end time of the charge sharing operation and the start time of the precharge operation are changed in the second self refresh mode DSM to compensate or enhance the characteristic of the self refresh operation, the example embodiments may not be limited thereto. For example, the end time of the charge sharing operation may only be changed in the second self refresh mode DSM, or the start time of the precharge operation may only be changed in the second self refresh mode DSM, to compensate or enhance the characteristic of the self refresh operation.

Figure 8A:
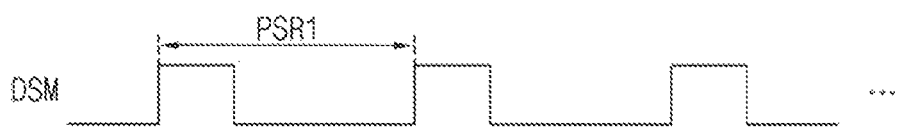
FIGS. 8A, 8B and 8C are graphs for describing another example of compensating a characteristic of a self refresh operation according to example embodiments.
Figure 8B:
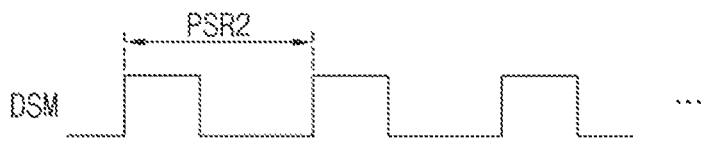
Figure 8C:
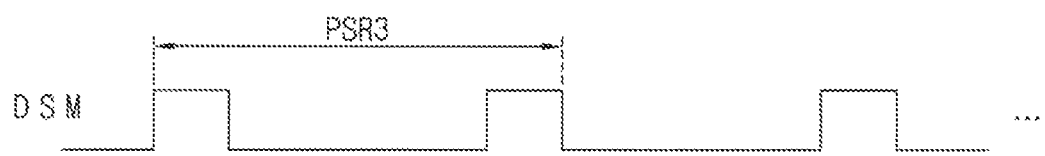

FIGS. 8A, 8B and 8C are graphs for describing another example of compensating a characteristic of a self refresh operation according to example embodiments.

In FIGS. 8A, 8B and 8C, a logic high level in the second self refresh mode DSM represents a time interval in which the self refresh operation is actually performed, and a logic low level in the second self refresh mode DSM represents a time interval in which the self refresh operation is not performed.

Referring to FIGS. 1, 2, 3 and 8A, the self refresh operation may be repeatedly performed for every first period PSR1 in the second self refresh mode DSM. Generally, the first period PSR1 may be substantially the same as a period of the self refresh operation in the first self refresh mode SR.

Referring to FIGS. 1, 2, 3, 8B and 8C, in the method of operating the memory device 200 according to example embodiments, a period of the self refresh operation in the second self refresh mode DSM may be adaptively controlled according to a level change of the first operating voltage to compensate or enhance a characteristic of the self refresh operation in the second self refresh mode DSM.

In some example embodiments, as illustrated in FIG. 8B, the self refresh operation may be repeatedly performed for every second period PSR2 in the second self refresh mode DSM. The second period PSR2 may be shorter than the first period PSR1. In other words, the period of the self refresh operation may decrease in the second self refresh mode DSM.

In other example embodiments, as illustrated in FIG. 8C, the self refresh operation may be repeatedly performed for every third period PSR3 in the second self refresh mode DSM. The third period PSR3 may be longer than the first period PSR1. In other words, the period of the self refresh operation may increase in the second self refresh mode DSM.

In still other example embodiments, although not illustrated in FIGS. 8A, 8B and 8C, the period of the self refresh operation may be adaptively controlled or adjusted in a single second self refresh mode DSM.

Figure 9:
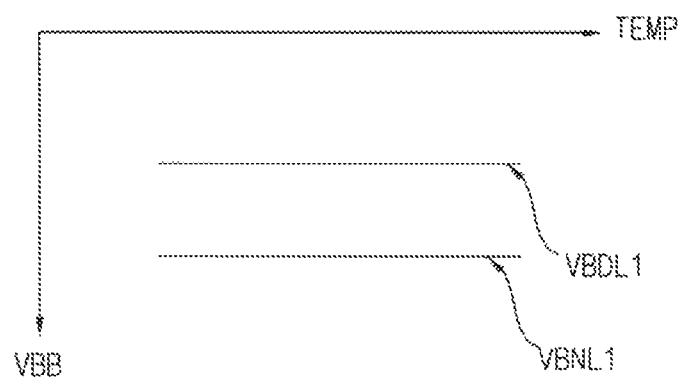
FIG. 9 is a graph for describing another example of changing a level of an operating voltage according to example embodiments.

FIG. 9 is a graph for describing another example of changing a level of an operating voltage according to example embodiments.

Referring to FIGS. 1, 2, 3 and 9, in the normal mode NM, the memory device 200 may generate the second operating voltage VBB having a third level VBNL1 to provide the second operating voltage VBB to the plurality of memory cells (step S100). In the first self refresh mode SR, the memory device 200 may maintain the level of the second operating voltage VBB to the third level VBNL1 to provide the second operating voltage VBB to the plurality of memory cells (step S200). When the memory device 200 enters the second self refresh mode DSM, the memory device 200 may change the level of the second operating voltage VBB to a fourth level VBDL1 based on the second voltage control signal VC2 to provide the second operating voltage VBB to the plurality of memory cells (step S300). The fourth level VBDL1 may be higher than the third level VPNL3. When the memory device 200 exits the second self refresh mode DSM, the memory device 200 may restore the level of the second operating voltage VBB to the third level VBNL1 before the memory device 200 enters the normal mode NM (step S400). Each of the third level VBNL1 and the fourth level VBDL1 may be a fixed level that is maintained regardless of an operating temperature TEMP of the memory device 200. As described with reference to FIG. 6B, the self refresh current IDD6 may be reduced based on a level change of the second operating voltage VBB in the second self refresh mode DSM.

In some example embodiments, to generate the second voltage control signal VC2 for increasing the level of the second operating voltage VBB in the second self refresh mode DSM, the resistances of the resistors included in the second voltage controller 330 may be different from the resistances of the resistors R1, R2, R3 and R4 included in the first voltage controller 310.

Figure 10:
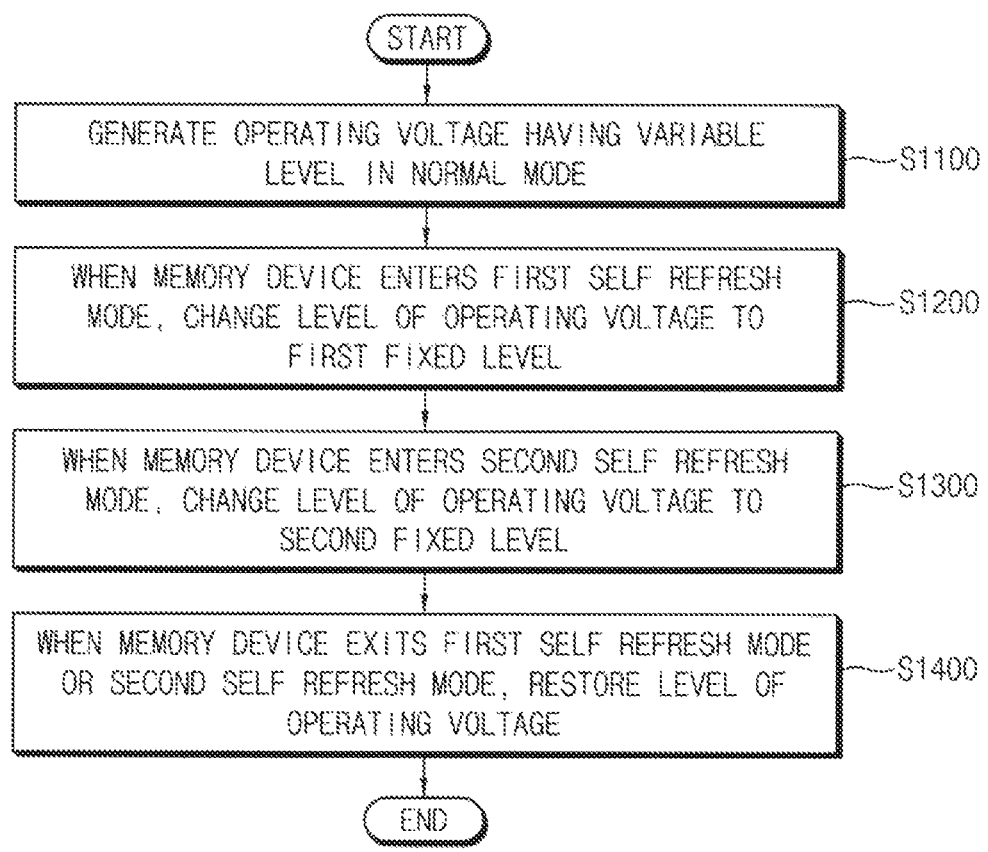
FIG. 10 is a flow chart illustrating a method of operating a memory device according to example embodiments.

FIG. 10 is a flow chart illustrating a method of operating a memory device according to example embodiments.

Referring to FIGS. 2 and 10, in a method of operating a memory device according to example embodiments, in the normal mode NM, an operating voltage is generated to provide the operating voltage to a plurality of memory cells that are included in the memory device (step S1100). In the normal mode NM, the operating voltage has a variable level that is changed according to an operating temperature of the memory device.

When the memory device enters the first self refresh mode SR, a level of the operating voltage is changed to a first fixed level to provide the operating voltage to the plurality of memory cells (step S1200). Unlike the variable level, the first fixed level is maintained regardless of the operating temperature of the memory device. In addition, the level of the operating voltage may be changed in the first self refresh mode SR to reduce power consumption of the memory device.

When the memory device enters the second self refresh mode DSM, the level of the operating voltage is changed to a second fixed level to provide the operating voltage to the plurality of memory cells (step S1300). As with the first fixed level, the second fixed level is maintained regardless of the operating temperature of the memory device. The second fixed level is different from the first fixed level. In addition, the level of the operating voltage may be changed in the second self refresh mode DSM to further reduce the power consumption of the memory device.

When the memory device exits the first self refresh mode SR or the second self refresh mode DSM, the level of the operating voltage may be restored (step S1400). For example, when the memory device exits the first self refresh mode SR, the level of the operating voltage may be immediately restored to the variable level. Since a time required to return from the second self refresh mode DSM to the normal mode NM is longer than the reference time, when the memory device exits the second self refresh mode DSM, the level of the operating voltage may be restored to an origin level (e.g., a level in the normal mode NM) before the memory device enters the normal mode NM.

Thus, in the normal mode NM after the first self refresh mode SR or the second self refresh mode DSM is terminated, the operating voltage having a restored level may be provided to the plurality of memory cells.

Figure 11:
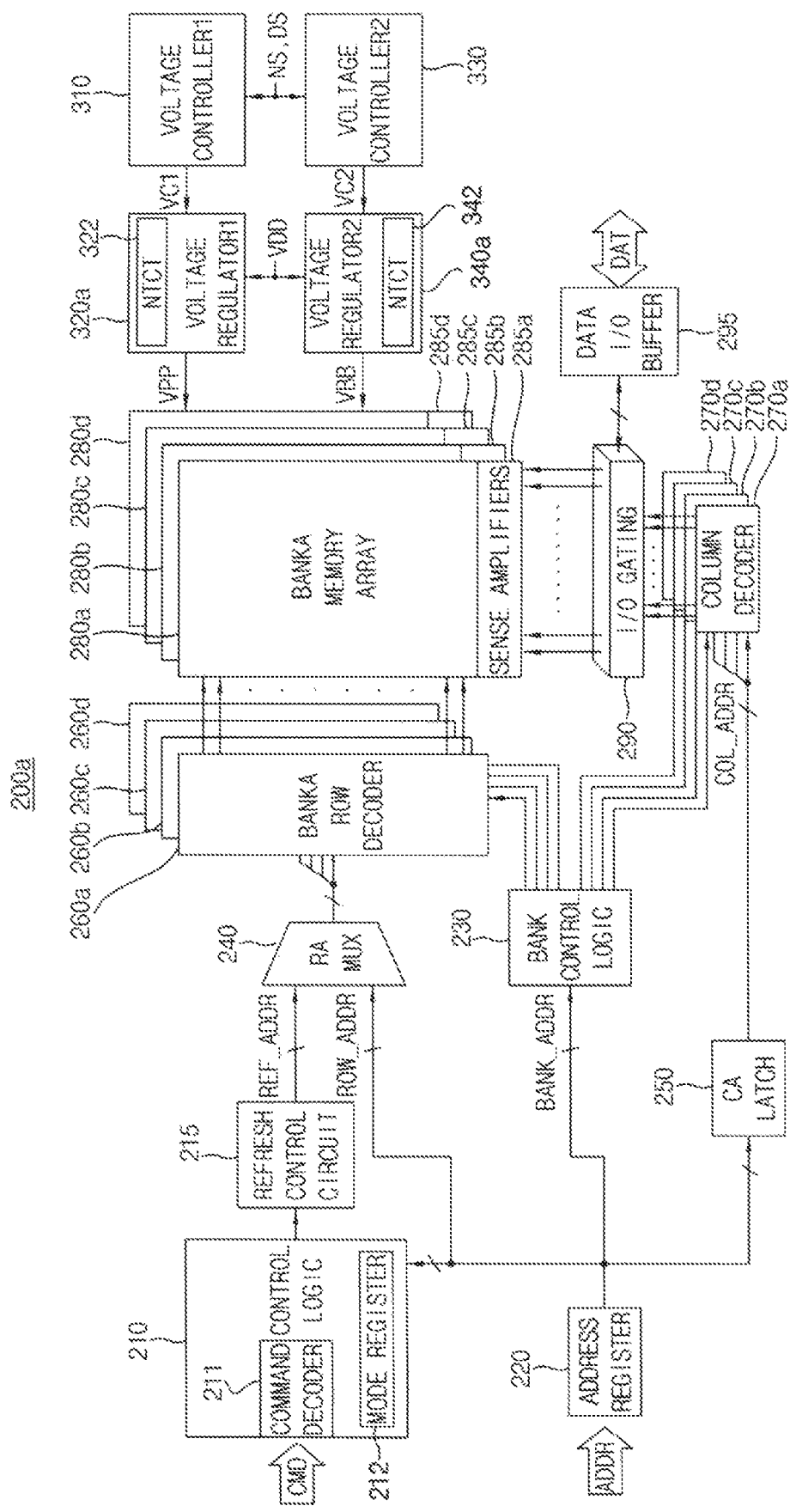
FIG. 11 is a block diagram illustrating a memory device according to example embodiments.

FIG. 11 is a block diagram illustrating a memory device according to example embodiments.

Referring to FIG. 11, a memory device 200a includes a control logic circuit 210, a refresh control circuit 215, an address register 220, a bank control logic circuit 230, a row address multiplexer 240, a column address latch 250, a row decoder, a column decoder, a memory cell array, a sense amplifier unit, an I/O gating circuit 290, a data I/O buffer 295, a first voltage controller 310, a first voltage regulator 320a, a second voltage controller 330 and a second voltage regulator 340a.

The memory device 200a of FIG. 11 may be substantially the same as the memory device 200 of FIG. 2, except that the first voltage regulator 320a and the second voltage regulator 340a in FIG. 11 include negative temperature coefficient (NTC) thermistors (NTCT) 322 and 342, respectively, and thus repeated explanation will be omitted.

The first voltage regulator 320a may enable the NTC thermistor 322 in the normal mode NM to generate the first operating voltage VPP having a variable level according to an operating temperature of the memory device 200a, and may disable the NTC thermistor 322 in each of the first self refresh mode SR and the second self refresh mode DSM to generate the first operating voltage VPP having a fixed level regardless of the operating temperature of the memory device 200a. In addition, the first voltage regulator 320a may control or adjust the level of the first operating voltage VPP based on the first voltage control signal VC1 such that the level of the first operating voltage VPP in the first self refresh mode SR and the level of the first operating voltage VPP in the second self refresh mode DSM are different from each other.

The second voltage regulator 340a may enable the NTC thermistor 342 in the normal mode NM to generate the second operating voltage VBB having a variable level according to the operating temperature of the memory device 200a, and may disable the NTC thermistor 342 in each of the first self refresh mode SR and the second self refresh mode DSM to generate the second operating voltage VBB having a fixed level regardless of the operating temperature of the memory device 200a. In addition, the second voltage regulator 340a may control or adjust the level of the second operating voltage VBB based on the second voltage control signal VC2 such that the level of the second operating voltage VBB in the first self refresh mode SR and the level of the second operating voltage VBB in the second self refresh mode DSM are different from each other.

Figure 12A:
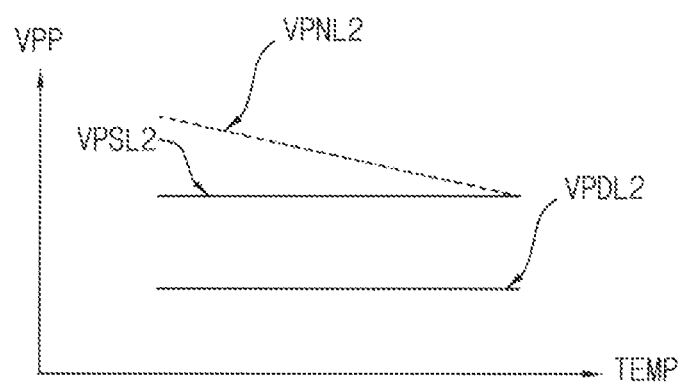
FIGS. 12A, 12B and 13 are graphs for describing still another example of changing a level of an operating voltage according to example embodiments.
Figure 12B:
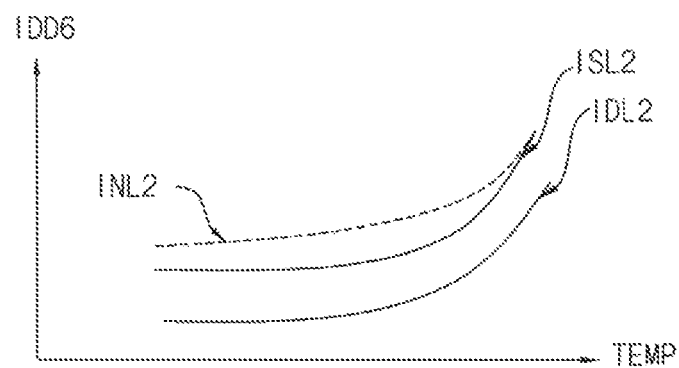
Figure 13:
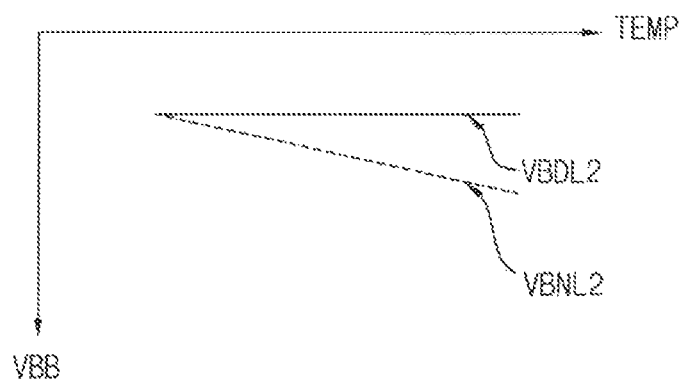

FIGS. 12A, 12B and 13 are graphs for describing still another example of changing a level of an operating voltage according to example embodiments.

Referring to FIGS. 10, 11 and 12A, in the normal mode NM, the memory device 200a may generate the first operating voltage VPP having a first variable level VPNL2 with respect to the temperature TEMP of the memory device 200a, by enabling the NTC thermistor 322, to provide the first operating voltage VPP to the plurality of memory cells (step S1100). When the memory device 200a enters the first self refresh mode SR, the memory device 200a may change the level of the first operating voltage VPP to a first fixed level VPSL2, by disabling the NTC thermistor 322, to provide the first operating voltage VPP to the plurality of memory cells (step S1200). The first fixed level VPSL2 may be lower than or equal to the first variable level VPNL2. When the memory device 200a enters the second self refresh mode DSM, the memory device 200a may change the level of the first operating voltage VPP to a second fixed level VPDL2, by disabling the NTC thermistor 322 and based on the first voltage control signal VC1, to provide the first operating voltage VPP to the plurality of memory cells (step S1300). The second fixed level VPDL2 may be lower than the first variable level VPNL2 and the first fixed level VPSL2. When the memory device 200a exits the first self refresh mode SR or the second self refresh mode DSM, the memory device 200a may restore the level of the first operating voltage VPP (step S1400).

In some example embodiments, when the memory device 200a exits the first self refresh mode SR, the memory device 200a may immediately restore the level of the first operating voltage VPP to the first variable level VPNL2, by enabling the NTC thermistor 322. When the memory device 200a exits the second self refresh mode DSM, the memory device 200a may restore the level of the first operating voltage VPP to the first variable level VPNL2, by enabling the NTC thermistor 322 and based on the first voltage control signal VC1, before the memory device 200a enters the normal mode NM.

As illustrated in FIG. 12A, the first variable level VPNL2 may decrease as the operating temperature TEMP of the memory device 200a increases. For example, when the operating temperature TEMP is about 25 degrees Celsius, the first variable level VPNL2 may be about 3.4 V, the first fixed level VPSL2 may be about 3.2 V, and the second fixed level VPDL2 may be about 3.0 V.

In some example embodiments, when the level of the first operating voltage VPP is changed as illustrated in FIG. 12A, an operation of adaptively controlling the execution time of the self refresh operation in the second self refresh mode DSM that is described with reference to FIG. 7 may be further performed, and/or an operation of adaptively controlling the period of the self refresh operation in the second self refresh mode DSM that is described with reference to FIGS. 8A, 8B and 8C may be further performed, to compensate or enhance a characteristic of the self refresh operation in the second self refresh mode DSM.

Referring to FIGS. 10, 12A and 12B, in the normal mode NM in which the first operating voltage VPP has the first variable level VPNL2, a self refresh current IDD6 may have a first value that varies with respect to the temperature TEMP of the memory device 200a according to a first curve INL2. In the first self refresh mode SR in which the first operating voltage VPP has the first fixed level VPSL2, the self refresh current IDD6 may have a second value that varies according to a second curve ISL2. The second value may be lower than or equal to the first value. In the second self refresh mode DSM in which the first operating voltage VPP has the second fixed level VPDL2, the self refresh current IDD6 may have a third value that varies according to a third curve IDL2. The third value may be lower than the second value. As illustrated in FIG. 12B, the self refresh current IDD6 may be reduced in the first self refresh mode SR and the second self refresh mode DSM, and thus the power consumption of the memory device 200a may also be reduced.

Referring to FIGS. 10, 11 and 13, in the normal mode NM, the memory device 200a may generate the second operating voltage VBB having a second variable level VBNL2 with respect to the temperature TEMP of the memory device 200a, by enabling the NTC thermistor 342, to provide the second operating voltage VBB to the plurality of memory cells (step S1100). When the memory device 200a enters the second self refresh mode DSM, the memory device 200a may change the level of the second operating voltage VBB to a third fixed level VBDL2, by disabling the NTC thermistor 342 and based on the second voltage control signal VC2, to provide the second operating voltage VBB to the plurality of memory cells (step S1300). The third fixed level VBDL2 may be higher than the second variable level VBNL2. When the memory device 200a exits the second self refresh mode DSM, the memory device 200a may restore the level of the second operating voltage VBB (step S1400). For example, when the memory device 200a exits the second self refresh mode DSM, the memory device 200a may restore the level of the second operating voltage VBB to the second variable level VBNL2, by enabling the NTC thermistor 342 and based on the second voltage control signal VC2, before the memory device 200a enters the normal mode NM. As described with reference to FIG. 12B, the self refresh current IDD6 may be reduced based on a level change of the second operating voltage VBB in the second self refresh mode DSM.

Although not illustrated in FIG. 13, as with an example of FIG. 12A, when the memory device 200a enters the first self refresh mode SR, the memory device 200a may change the level of the second operating voltage VBB to a fourth fixed level, by disabling the NTC thermistor 342, to provide the second operating voltage VBB to the plurality of memory cells (step S1200). The fourth fixed level may be higher than or equal to the second variable level VBNL2, and may be lower than third fixed level VBDL2.

According to example embodiments, steps S100, S200, S300 and S400 in FIG. 1 and/or steps S1100, S1200, S1300 and S1400 in FIG. 10 may be performed for only the first operating voltage VPP, for only the second operating voltage VBB or for both the first and second operating voltages VPP and VBB. Alternatively, in an example where two or more boost voltages and/or two or more negative voltages are used for operating a memory device, steps S100, S200, S300 and S400 in FIG. 1 and/or steps S1100, S1200, S1300 and S1400 in FIG. 10 may be performed for two or more boost voltages and/or two or more negative voltages.

In the methods of operating the memory devices 200 and 200a and the memory devices 200 and 200a according to example embodiments, the level of the operating voltage in the second self refresh mode DSM in which the self refresh operation is performed may be different from the level of the operating voltage in the normal mode NM. Also, a time required to return to the normal mode NM may be longer for the second self refresh mode DSM than the reference time. For example, in the second self refresh mode DSM, the level of the first operating voltage VPP that is higher than the power supply voltage VDD may decrease, and the level of the second operating voltage VBB that is lower than the ground voltage VSS may increase. In addition, in the second self refresh mode DSM, the execution time of the self refresh operation and/or the period of the self refresh operation may be adaptively controlled. Accordingly, in the second self refresh mode DSM, the self refresh current IDD6 may be reduced by compensating or enhancing a characteristic of the self refresh operation, and thus the power consumption of the memory devices 200 and 200a may also be reduced.

As will be appreciated by those skilled in the art, the present disclosure may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device. For example, the computer readable medium may be a non-transitory computer readable medium.

FIG. 14 is a block diagram illustrating a memory system including a memory device according to example embodiments.

Referring to FIG. 14, a memory system 500 includes a memory controller 100 and a memory device 200.

The memory device 200 is controlled and/or accessed by the memory controller 100. For example, based on requests from an external device (e.g., a host), the memory controller 100 may store (e.g., write) data into the memory device 200, or may retrieve (e.g., read) data from the memory device 200.

The memory controller 100 transmits a command CMD and an address ADDR to the memory device 200 via control signal lines, and exchanges data DAT with the memory device 200 via data I/O lines. At least a part or all of the control signal lines and the data I/O lines may be referred to as a channel.

Although not illustrated in FIG. 14, the memory controller 100 may further transmit a control signal to the memory device 200 via the control signal lines, or may further transmit a power supply voltage to the memory device 200 via power lines. For example, the control signal may include a data strobe signal (DQS), a chip enable signal (/CE), a write enable signal (/WE), a read enable signal (/RE), a command latch enable signal (CLE), an address latch enable signal (ALE), etc.

The memory device 200 may be the memory device according to example embodiments. The memory device 200 may perform the refresh operation for retaining stored data based on the command CMD, and may perform the self refresh operation for retaining stored data without the command CMD. In addition, in the memory device 200, the level of the operating voltage provided to the memory cells in the second self refresh mode DSM may be changed in comparison with the level of the operating voltage provided to the memory cells in the normal mode NM, thereby reducing power consumption of the memory device 200.

Figure 15:
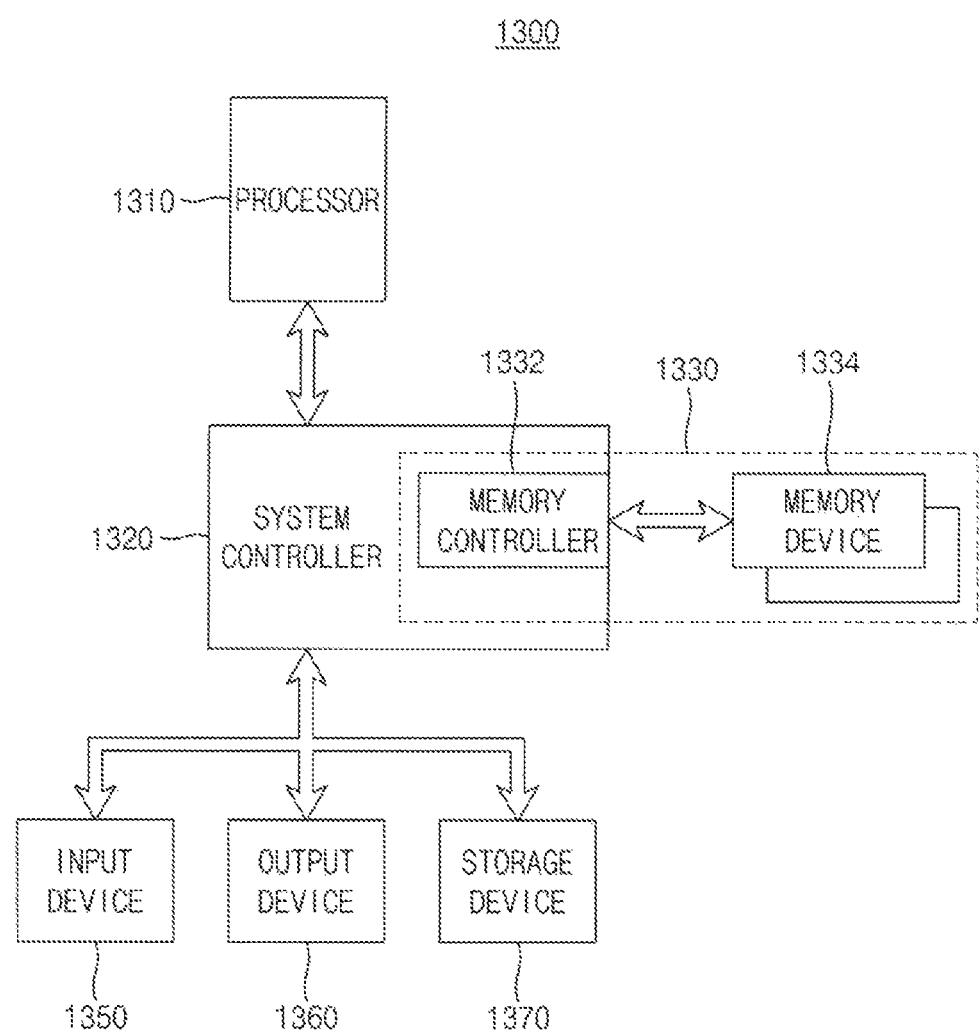
FIG. 15 is a block diagram illustrating a computing system including a memory device according to example embodiments.

FIG. 15 is a block diagram illustrating a computing system including a memory device according to example embodiments.

Referring to FIG. 15, a computing system 1300 includes a processor 1310, a system controller 1320 and a memory system 1330. The computing system 1300 may further include an input device 1350, an output device 1360 and a storage device 1370.

The memory system 1330 includes a plurality of memory devices 1334, and a memory controller 1332 for controlling the memory devices 1334. The memory controller 1332 may be included in the system controller 1320. The memory devices 1334, the memory controller 1332 and the memory system 1330 may operate based on the methods according to example embodiments.

The processor 1310 may perform various computing functions, such as executing specific software instructions for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320.

The present disclosure may be applied to various devices and systems that include memory devices (e.g., volatile memory devices). For example, the present disclosure may be applied to systems such as be a mobile phone, a smart phone, a tablet computer, a laptop computer, a personal digital assistants (PDA), a portable multimedia player (PMP), a digital camera, a portable game console, a wearable system, an internet of things (IoT) system, a virtual reality (VR) system, an augmented reality (AR) system, etc.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a memory device that includes a plurality of memory cells and operates in one of a normal mode, a first self refresh mode and a second self refresh mode, the first self refresh mode executing a self refresh operation for retaining data stored in the plurality of memory cells without an external command, a time required to return to the normal mode from the first self refresh mode is shorter than a reference time, the second self refresh mode executing the self refresh operation, and a time required to return to the normal mode from the second self refresh mode is longer than the reference time, the method comprising:
   in the normal mode, generating a first operating voltage having a first variable level and providing the first operating voltage to the plurality of memory cells, the first variable level being changed according to an operating temperature of the memory device;
   in response to the memory device entering the first self refresh mode, changing a level of the first operating voltage to a first fixed level and providing the first operating voltage to the plurality of memory cells, the first fixed level being maintained regardless of the operating temperature of the memory device; and
   in response to the memory device entering the second self refresh mode, changing the level of the first operating voltage to a second fixed level and providing the first operating voltage to the plurality of memory cells, the second fixed level being lower than the first variable level and the first fixed level and being maintained regardless of the operating temperature of the memory device.

2. The method of claim 1, wherein:
   in the normal mode, the first operating voltage having the first variable level is generated by enabling a negative temperature coefficient (NTC) thermistor that is included in the memory device, and
   in the first self refresh mode, the first operating voltage having the first fixed level is generated by disabling the NTC thermistor.

3. The method of claim 1, wherein:
   in response to the memory device exiting the first self refresh mode, the memory device immediately enters the normal mode, and
   in response to the memory device exiting the second self refresh mode, the memory device enters the normal mode via the first self refresh mode.

4. The method of claim 1, further comprising:
   in the normal mode, generating a second operating voltage having a second variable level and providing the second operating voltage to the plurality of memory cells, the second variable level being changed according to the operating temperature of the memory device; and
   in response to the memory device entering the second self refresh mode, changing a level of the second operating voltage to a third fixed level and providing the second operating voltage to the plurality of memory cells, the third fixed level being higher than the second variable level and being maintained regardless of the operating temperature of the memory device.

5. A memory device comprising:
   a memory cell array including a plurality of memory cells that operates based on a first operating voltage;
   a first voltage controller that generates a first voltage control signal for controlling a level of the first operating voltage based on a first control signal and a second control signal; and
   a first voltage regulator that generates the first operating voltage based on a power supply voltage and the first voltage control signal, sets the level of the first operating voltage to a first level in a normal mode, sets the level of the first operating voltage to a second level in a first self refresh mode, and sets the level of the first operating voltage to a third level in a second self refresh mode, the third level being lower than the first level and the second level, wherein:
   the first self refresh mode executes a self refresh operation for retaining data stored in the plurality of memory cells without an external command, and a time required to return to the normal mode from the first self refresh mode is shorter than a reference time, and
   the second self refresh mode executes the self refresh operation, and a time required to return to the normal mode from the second self refresh mode is longer than the reference time, wherein:
   the first level is a variable level that is changed according to an operating temperature of the memory device, and
   the second level is a fixed level that is maintained regardless of the operating temperature of the memory device.

6. The memory device of claim 5, wherein the first voltage controller includes:
   a first circuit connected to a first node, receiving a reference voltage, and a second node; and
   a second circuit connected to the second node, and an output node outputting the first voltage control signal, the second circuit receives the first control signal and the second control signal, wherein the second circuit includes:

a first resistor connected between the output node and the second node;
a second resistor connected to the second node;
a first transistor connected between the second resistor and a ground voltage, the first transistor including a gate electrode receiving the first control signal;
a third resistor connected in parallel with the first resistor between the output node and the second node;
a fourth resistor connected to the second node; and
a second transistor connected between the fourth resistor and the ground voltage, the second transistor including a gate electrode receiving the second control signal.

7. The memory device of claim 6, wherein:
a resistance of the first resistor is greater than a resistance of the third resistor, and a resistance of the second resistor is smaller than a resistance of the fourth resistor, and
a first value obtained by dividing the resistance of the second resistor by the resistance of the first resistor is smaller than a second value obtained by dividing the resistance of the fourth resistor by the resistance of the third resistor.

8. The memory device of claim 5, wherein the second level is equal to the first level.

9. The memory device of claim 5, wherein:
the plurality of memory cells also operates based on a second operating voltage,
the memory device further includes:
a second voltage controller that generates a second voltage control signal for controlling a level of the second operating voltage based on the first control signal and the second control signal; and
a second voltage regulator that generates the second operating voltage based on the power supply voltage and the second voltage control signal, sets the level of the second operating voltage to a fourth level in the normal mode, sets the level of the second operating voltage to a fifth level in the first self refresh mode, and sets the level of the second operating voltage to a sixth level in the second self refresh mode, and
the sixth level is higher than the fourth level and the fifth level.

10. A method of operating a memory device that includes a plurality of memory cells and operates in one of a normal mode, a first self refresh mode and a second self refresh mode, the first self refresh mode executing a self refresh operation for retaining data stored in the plurality of memory cells without an external command, a time required to return to the normal mode from the first self refresh mode is shorter than a reference time, the second self refresh mode executing the self refresh operation, and a time required to return to the normal mode from the second self refresh mode is longer than the reference time, the method comprising:
in the normal mode, generating a first operating voltage having a first variable level and providing the first operating voltage to the plurality of memory cells, the first variable level being changed according to an operating temperature of the memory device;
in response to the memory device entering the first self refresh mode, changing a level of the first operating voltage to a first fixed level and providing the first operating voltage to the plurality of memory cells, the first fixed level being maintained regardless of the operating temperature of the memory device; and
in response to the memory device entering the second self refresh mode, changing the level of the first operating voltage to a second fixed level and providing the first operating voltage to the plurality of memory cells, the second fixed level being lower than the first variable level and the first fixed level and being maintained regardless of the operating temperature of the memory device, wherein
the plurality of memory cells are capable of being programmed during the normal mode, but not during the first self refresh mode and the second self refresh mode.

11. The method of claim 10, wherein the data stored by the plurality of memory cells are capable of being read during the normal mode, but not during the first self refresh mode and the second self refresh mode.

12. The method of claim 10, wherein a maximum amplitude of the first fixed level exceeds a maximum amplitude of the second fixed level.

13. The method of claim 12, further comprising varying the maximum amplitude of the first fixed level in dependence of a temperature of the memory device.

14. The method of claim 10, wherein a maximum amplitude of each of the first fixed level and the second fixed level is invariant with a temperature of the memory device.

15. The method of claim 10, wherein a period between consecutive operations of refreshing the data stored by the plurality of memory cells is greater during each of the first self refresh mode and the second self refresh mode than during the normal mode.

16. The method of claim 10, wherein a period during which the second fixed level is applied for refreshing the data stored by the plurality of memory cells is greater than a period during which the first fixed level is applied for refreshing the data stored by the plurality of memory cells.

17. The method of claim 10, wherein a bit line addressing the plurality of memory cells is pre-charged for a longer period during which the second fixed level is applied for refreshing the data stored by the plurality of memory cells than a period during which the first fixed level is applied for refreshing the data stored by the plurality of memory cells.

18. The method of claim 10, wherein a period of the second self refresh mode is based upon a voltage difference between the second fixed level and the first fixed level.

19. The method of claim 10, further comprising controlling an initiation time of the second self refresh mode according to a voltage difference between the second fixed level and the first fixed level.

20. The method of claim 19, wherein the initiation time of the second self refresh mode is controlled by changing an end time of a charge sharing operation for a bit line connected to the plurality of memory cells.

* * * * *